(12) United States Patent
Su et al.

(10) Patent No.: US 12,127,415 B2
(45) Date of Patent: Oct. 22, 2024

(54) MANUFACTURING METHOD FOR CAPACITOR STRUCTURE, CAPACITOR STRUCTURE AND MEMORY

(71) Applicant: CHANGXIN MEMORY TECHNOLOGIES, INC., Hefei (CN)

(72) Inventors: Xingsong Su, Hefei (CN); Weiping Bai, Hefei (CN); Mengkang Yu, Hefei (CN); Lianhong Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/606,209

(22) PCT Filed: Jun. 8, 2021

(86) PCT No.: PCT/CN2021/098844
§ 371 (c)(1),
(2) Date: Oct. 25, 2021

(87) PCT Pub. No.: WO2022/147958
PCT Pub. Date: Jul. 14, 2022

(65) Prior Publication Data
US 2024/0032313 A1    Jan. 25, 2024

(30) Foreign Application Priority Data
Jan. 7, 2021  (CN) .......................... 202110015902.2

(51) Int. Cl.
*H10K 10/10*    (2023.01)
*H01L 49/02*    (2006.01)
*H10B 12/00*    (2023.01)

(52) U.S. Cl.
CPC ............. *H10K 10/10* (2023.02); *H01L 28/56* (2013.01); *H01L 28/75* (2013.01); *H10B 12/03* (2023.02)

(58) Field of Classification Search
CPC ... H01L 28/55–56; H01L 28/75; H10K 10/10; H10B 12/03
See application file for complete search history.

(56) References Cited

U.S. PATENT DOCUMENTS

| | | | |
|---|---|---|---|
| 6,388,285 B1 | 5/2002 | Black et al. | |
| 6,500,678 B1 | 12/2002 | Aggarwal et al. | |

(Continued)

FOREIGN PATENT DOCUMENTS

| | | |
|---|---|---|
| CN | 1424744 A | 6/2003 |
| CN | 101276690 A | 10/2008 |

(Continued)

OTHER PUBLICATIONS

International Search Report (ISR) in international application No. PCT/CN2021/098844 mailed on Sep. 28, 2021.

(Continued)

*Primary Examiner* — Jose R Diaz
(74) *Attorney, Agent, or Firm* — Syncoda LLC; Feng Ma

(57) ABSTRACT

A capacitor structure includes two electrodes arranged oppositely and a dielectric layer located between the two electrodes, wherein the dielectric layer includes at least two perovskite layers stacked; an amorphous layer is provided between every two adjacent perovskite layers; two outermost perovskite layers of the at least two perovskite layers are in contact with the two electrodes, respectively.

14 Claims, 6 Drawing Sheets

(56) References Cited

U.S. PATENT DOCUMENTS

| | | |
|---|---|---|
| 2008/0160712 A1 | 7/2008 | Park |
| 2008/0232023 A1 | 9/2008 | Oakes et al. |
| 2009/0130457 A1* | 5/2009 | Kim .................... H01G 4/1218 |
| | | 428/432 |
| 2010/0172065 A1 | 7/2010 | Huang et al. |
| 2013/0122682 A1 | 5/2013 | Deweerd et al. |
| 2013/0143383 A1 | 6/2013 | Malhotra et al. |
| 2020/0243266 A1 | 7/2020 | Totsuka |

FOREIGN PATENT DOCUMENTS

| | | |
|---|---|---|
| CN | 101542657 A | 9/2009 |
| CN | 106340386 A | 1/2017 |
| CN | 109637809 A | 4/2019 |
| CN | 111599827 A | 8/2020 |
| CN | 111908914 A | 11/2020 |
| CN | 112864319 A | 5/2021 |
| KR | 20080084434 A | 9/2008 |
| WO | 2020102416 A1 | 5/2020 |

OTHER PUBLICATIONS

Ji-Hoon Ahn et al.: Effect of Al2O3 insertion on the electrical properties of SrTiO3 thin flms A comparison between Al2O3-doped SrTiO3 and SrTiO3Al2O3SrTiO3 sandwich structure, Materials Research Bulletin 64 (2015) 1-5.

J. H. Lee et al.: New metal-insulator-metal capacitor based on SrTiO3_Al2O3_SrTiO3 laminate dielectric, IEEE, Dec. 13, 2010.

China first office action in Application No. 202110015902.2, mailed on Mar. 1, 2022.

Sita Dugu et al.: SiSrTiO3—Al2O3—SiSrTiO3 multi-dielectric architecture for metal-insulator-metal capacitor applications, Applied Physics Letters 109, 212901 (2006).

* cited by examiner

MANUFACTURING METHOD FOR CAPACITOR STRUCTURE, CAPACITOR STRUCTURE AND MEMORY

CROSS-REFERENCE TO RELATED APPLICATIONS

This application is a national stage of International Application No. PCT/CN2021/098844 filed on Jun. 8, 2021, which claims priority to Chinese Patent Application No. 202110015902.2 filed on Jan. 07, 2021. The disclosures of the above-referenced applications are hereby incorporated by reference in their entirety.

TECHNICAL FIELD

The present application relates to the technical field of semiconductors, in particular to a manufacturing method for capacitor structure, a capacitor structure and a memory.

BACKGROUND

Dynamic random access memory (DRAM) is widely used in various electronic devices due to its high storage density and fast reading and writing speed. DRAM is generally composed of multiple memory cells. Each memory cell typically comprises a transistor and a capacitor structure. The capacitor structure is used to store data information, and the transistor is used to control the reading and writing of data information in the capacitor structure.

The capacitor structure comprises two electrodes arranged oppositely and a dielectric layer located between the two electrodes. The dielectric layer is usually an oxide, such as silicon oxide ($SiO_2$). The dielectric layer has a small dielectric constant, so there is a leakage current between the dielectric layer and the electrode that are in contact, leading to poor performance of the capacitor structure.

SUMMARY

In view of this, the present application provides a manufacturing method for capacitor structure, a capacitor structure and a memory. The present application solves the technical problem of poor performance of the capacitor structure.

In a first aspect, the present application provides a capacitor structure. The capacitor structure comprises two electrodes arranged oppositely and a dielectric layer located between the two electrodes, wherein the dielectric layer comprises at least two perovskite layers stacked; an amorphous layer is provided between every two adjacent perovskite layers; two outermost perovskite layers of the at least two perovskite layers are in contact with the two electrodes, respectively.

The capacitor structure provided by the present application has the following advantages:

The capacitor structure provided by the present application comprises two electrodes and a dielectric layer. The two electrodes are arranged oppositely, and the dielectric layer is provided between the two electrodes. The dielectric layer comprises two or more perovskite layers stacked. Two outermost perovskite layers are in one-to-one correspondence and contact with the two electrodes. An amorphous layer is provided between two adjacent perovskite layers to suppress the output of electrons, thereby reducing the leakage current of the capacitor structure and improving the performance of the capacitor structure.

In the above-mentioned capacitor structure, at least one of the two outermost perovskite layers comprise two sub-layers; one of the two sub-layers is a doped perovskite layer in contact with the electrode, and the other of the two sub-layers is an undoped perovskite layer.

In the above-mentioned capacitor structure, the doped perovskite layer is made of strontium titanate doped with aluminum or barium titanate doped with silicon.

In the above-mentioned capacitor structure, the undoped perovskite layer is made of strontium titanate or barium titanate.

In the above-mentioned capacitor structure, the thickness of each of the two sub-layers is less than or equal to 5 nm.

In the above-mentioned capacitor structure, the amorphous layer is made of a material comprising aluminum oxide or silicon oxide.

In the above-mentioned capacitor structure, the thickness of the amorphous layer is less than or equal to 5 nm.

In the above-mentioned capacitor structure, the amorphous layer and the perovskite layer are formed by using a physical vapor deposition (PVD) process, a chemical vapor deposition (CVD) process or an atomic layer deposition (ALD) process.

In the above-mentioned capacitor structure, the dielectric layer comprises two or more amorphous layers; the perovskite layer located between two amorphous layers is an undoped perovskite layer.

In the above-mentioned capacitor structure, the thickness of the perovskite layer located between two amorphous layers is less than or equal to 5 nm.

In a second aspect, the present application provides a memory. The memory comprises a transistor and the above-mentioned capacitor structure.

The memory provided by the present application comprises a transistor and the above-mentioned capacitor structure, and thus has the advantages of the above-mentioned capacitor structure. That is, the memory has a low leakage current and desirable performance. The specific effect is described above, and will not be repeated here.

In a third aspect, the present application provides a manufacturing method for capacitor structure. The method comprises: depositing a first perovskite layer on a first electrode; depositing an intermediate layer on the first perovskite layer, wherein the intermediate layer comprises an amorphous layer; depositing a second perovskite layer on the intermediate layer, wherein a dielectric layer is composed of the first perovskite layer, the intermediate layer and the second perovskite layer; and depositing a second electrode on the dielectric layer.

The manufacturing method for capacitor structure provided by the present application has the following advantages:

In the manufacturing method for capacitor structure provided by the present application, first, a first perovskite layer is deposited on a first electrode. Second, an intermediate layer is deposited on the first perovskite layer. The intermediate layer comprises an amorphous layer, which suppresses the output of electrons, thereby reducing the leakage current of the capacitor structure. Third, a second perovskite layer is deposited on the intermediate layer. A dielectric layer is composed of the first perovskite layer, the intermediate layer and the second perovskite layer. Finally, a second electrode is deposited on the dielectric layer. A capacitor structure is composed of the first electrode, the dielectric layer and the second electrode, which has a low leakage current and desirable performance.

In the above-mentioned manufacturing method for capacitor structure, the step of depositing a first perovskite layer on a first electrode comprises: depositing a first sub-layer on the first electrode, wherein the first sub-layer is a doped perovskite layer; and depositing a second sub-layer on the first sub-layer, wherein the second sub-layer is an undoped perovskite layer; the first perovskite layer is composed of the first sub-layer and the second sub-layer.

In the above-mentioned manufacturing method for capacitor structure, the step of depositing a second perovskite layer on the intermediate layer comprises: depositing a third sub-layer on the intermediate layer, wherein the third sub-layer is an undoped perovskite layer; and depositing a fourth sub-layer on the third sub-layer, wherein the fourth sub-layer is a doped perovskite layer; the second perovskite layer is composed of the third sub-layer and the fourth sub-layer.

In the above-mentioned manufacturing method for capacitor structure, the intermediate layer comprises two or more amorphous layers, and an intermediate perovskite layer is provided between every two adjacent amorphous layers.

In the above-mentioned manufacturing method for capacitor structure, the intermediate perovskite layer is an undoped perovskite layer.

The present application provides a manufacturing method for capacitor structure, a capacitor structure and a memory. The present application describes the technical problems solved by the embodiments of the present application, the technical features constituting the technical solutions and the beneficial effects brought about by the technical features of these technical solutions. In addition, other technical problems to be solved the embodiments of the present application, other technical features included in the technical solutions and beneficial effects brought about by these technical features will be described in further detail in the detailed description.

DETAILED DESCRIPTION

Figure 1:
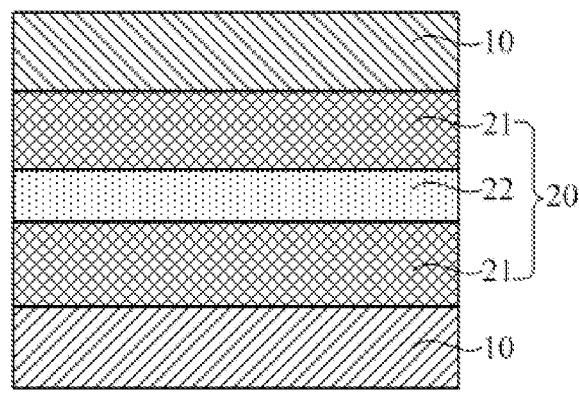
FIG. 1 is a first schematic diagram of a capacitor structure according to an embodiment of the present application.

A memory stores data groups temporarily or permanently. A dynamic random access memory (DRAM) typically includes multiple capacitor structures. The capacitor structure is used to store a charge so as to store information. It is a temporary data storage medium and can be used as a memory.

The capacitor structure typically comprises two electrodes arranged oppositely and a dielectric layer located between the two electrodes. In the related art, the dielectric layer of the capacitor structure is typically made of silicon oxide, which has a small dielectric constant, so there is a high leakage current between the dielectric layer and the electrode.

An embodiment of the present application provides a capacitor structure. A dielectric layer of the capacitor structure comprises two or more perovskite layers stacked. Two outermost perovskite layers are in one-to-one correspondence and contact with two electrodes. The perovskite layer has a high dielectric constant, and an amorphous layer is provided between every two adjacent perovskite layers to suppress the output of electrons, so as to reduce the leakage current of the capacitor structure, thereby improving the performance of the capacitor structure.

In order to make the objectives, technical solutions and advantages of the embodiments of the present application clearer, the following clearly and completely describes the technical solutions in the embodiments of the present application with reference to the accompanying drawings in the embodiments of the present application. Apparently, the described embodiments are some rather than all of the embodiments of the present application. All other embodiments obtained by those of ordinary skill in the art based on the embodiments of the present application without creative efforts should fall within the protection scope of the present application.

Embodiment 1

The embodiment the present application provides a capacitor structure, which has a small leakage current. The capacitor structure comprises two electrodes arranged oppositely and a dielectric layer located between the two electrodes. That is, the capacitor structure is composed of the two electrodes and the dielectric layer.

The two electrodes are typically arranged in parallel, and the electrodes may be metal electrodes. Exemplarily, the electrode may be made of one or more of the group consisting of aluminum (Al), copper (Cu), silver (Ag), gold (Au), molybdenum (Mo), nickel (Ni), cobalt (Co), titanium (Ti) and tungsten (W). The electrode may also be made of an alloy of the above-mentioned metal or a mixture of the alloys of the above-mentioned metals.

The dielectric layer may comprise at least two perovskite layers. The multiple perovskite layers are stacked, and two outermost perovskite layers of the at least two perovskite layers are in contact with the two electrodes, respectively. That is, the two perovskite layers located on the outermost side are in one-to-one correspondence and contact with the two electrodes. In other words, one of the two outermost perovskite layers is in contact with one of the two electrodes, and the other of the two outermost perovskite layers is in contact with the other of the two electrodes.

The perovskite layer may be made of calcium titanate ($CaTiO_3$) or barium titanate ($BaTiO_3$), which has a high dielectric constant (high k) and achieves desirable insulating properties of the dielectric layer. Exemplarily, the dielectric constant of the perovskite layer may be 40-300, and the dielectric constant (k value) depends on design requirements. The dielectric constants of the multiple perovskite layers may be the same or different.

The perovskite layer may be formed by using a chemical vapor deposition (CVD) process, a physical vapor deposition (PVD) process or an atomic layer deposition (ALD) process, but the embodiment of the present application is not limited thereto. The perovskite layer in the embodiment of the present application may also be formed by using other processes, such as a sputtering process.

In order to further improve the performance of the capacitor structure, an amorphous layer is provided between every two adjacent perovskite layers. The amorphous layer is made of an amorphous structure material (amorphous material), in which the atoms or molecules are arranged in a disorderly state. Electrons are not easy to migrate in the amorphous structure material. In contrast, electrons tend to migrate in a grain boundary between crystal grains in a crystalline material with regularly arranged atoms or molecules. Therefore, the amorphous layer can suppress the output of electrons and reduce the leakage current, thereby improving the performance of the capacitor structure.

Exemplarily, when the dielectric layer comprises two perovskite layers, an amorphous layer is provided between the two perovskite layers. That is, the dielectric layer is composed of a perovskite layer, an amorphous layer and a perovskite layer. When the dielectric layer comprises three perovskite layers, an amorphous layer is provided between every two adjacent perovskite layers. That is, the dielectric layer is composed of a perovskite layer, an amorphous layer, a perovskite layer, an amorphous layer and a perovskite layer. When the dielectric layer comprises more than three perovskite layers, the dielectric layer may be defined with reference to the above-mentioned structure.

The amorphous layer may be made of a material, comprising aluminum oxide ($Al_2O_3$) or silicon oxide ($SiO_2$), and the thickness of the amorphous layer may be less than or equal to 5 nm. The amorphous layer may be formed by using a PVD process, a CVD process or an ALD process.

In the embodiment of the present application, the dielectric layer may comprise an amorphous layer.

Referring to FIG. 1, the dielectric layer 20 comprises a perovskite layer 21, an amorphous layer 22 and a perovskite layer 21 stacked in sequence from bottom to top. That is, the dielectric layer 20 comprises two perovskite layers 21 and an amorphous layer 22 located between the two perovskite layers 21.

One perovskite layer 21 of the two perovskite layers 21 is in contact with one electrode 10 of the two electrodes 10, and the other perovskite layer 21 of the two perovskite layers 21 is in contact with the other electrode 10 of the two electrodes 10. As shown in FIG. 1, a lower perovskite layer 21 is in contact with a lower electrode 10, and an upper perovskite layer 21 is in contact with an upper electrode 10.

Figure 2:
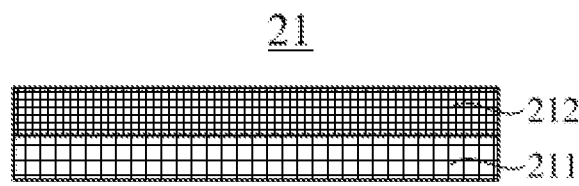
FIG. 2 is a schematic diagram of a sub-layer of a perovskite layer according to an embodiment of the present application.

In order to further reduce the leakage current of the capacitor structure, at least one perovskite layer 21 of the two outermost perovskite layers 21 may comprise two sub-layers. As shown in FIG. 2, one of the two sub-layers is a doped perovskite layer 211 in contact with the electrode 10, and the other of the two sub-layers is an undoped perovskite layer 212. In this way, there is a high shift in the conduction band between the doped perovskite layer and the electrode 10, which can suppress the generation of the leakage current, thereby further reducing the leakage current of the capacitor structure.

It is understandable that there are two perovskite layers 21 located in the outermost side. One perovskite layer 21 of the two perovskite layers 21 has two sub-layers, or the two perovskite layers 21 respectively have two sub-layers. When the two perovskite layers 21 respectively have two sub-layers, there is a high shift in the conduction band between each electrode 10 and the dielectric layer 20, which further reduces the leakage current of the capacitor structure. The thickness of each of the two sub-layers may be less than or equal to 5 nm.

Figure 3:
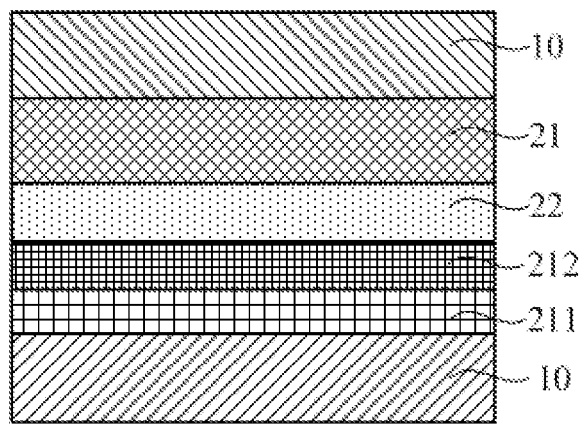
FIG. 3 is a first schematic diagram of a dielectric layer according to an embodiment of the present application.

In some possible examples, the perovskite layer 21 in contact with the lower electrode 10 may comprise two sub-layers as described above. As shown in FIG. 3, the capacitor structure comprises an electrode 10, a doped perovskite layer 211, an undoped perovskite layer 212, an amorphous layer 22, a perovskite layer 21 and an electrode 10 in sequence from bottom to top.

Figure 4:
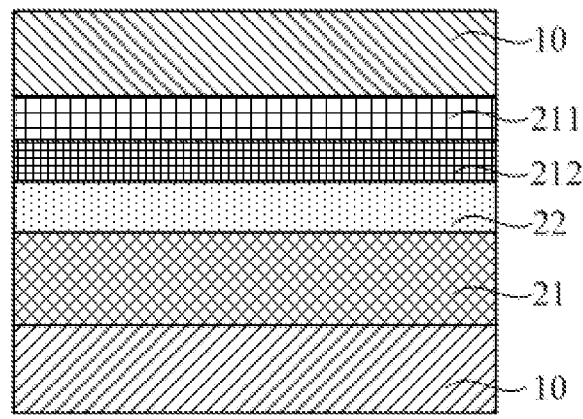
FIG. 4 is a second schematic diagram of the dielectric layer according to an embodiment of the present application.

In some other possible examples, the perovskite layer 21 in contact with the upper electrode 10 may comprise two sub-layers as described above. As shown in FIG. 4, the capacitor structure comprises an electrode 10, a perovskite layer 21, an amorphous layer 22, an undoped perovskite layer 212, a doped perovskite layer 211 and an electrode 10 in sequence from bottom to top.

Figure 5:
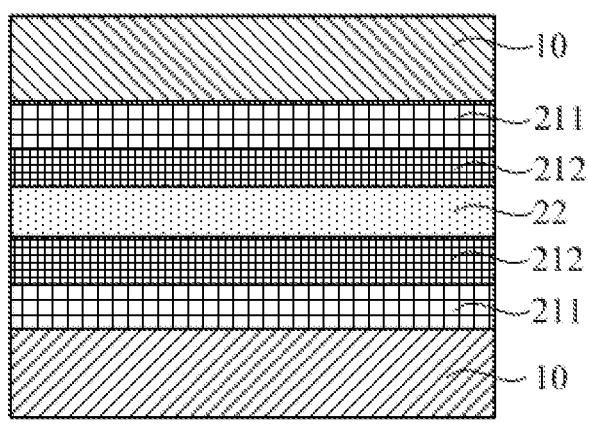
FIG. 5 is a third schematic diagram of the dielectric layer according to an embodiment of the present application.

In some possible examples, the two outermost perovskite layers 21 both comprise two sub-layers. That is, the perovskite layer 21 in contact with the upper electrode 10 and the perovskite layer 21 in contact with the lower electrode 10 both comprise two sub-layers as described above. As shown in FIG. 5, the capacitor structure comprises an electrode 10, a doped perovskite layer 211, an undoped perovskite layer 212, an amorphous layer 22, an undoped perovskite layer 212, a doped perovskite layer 211 and an electrode in sequence from bottom to top.

The doped perovskite layer may be made of strontium titanate ($SrTiO_3$) doped with aluminum (Al) or barium titanate ($BaTiO_3$) doped with silicon (Si). The undoped perovskite layer may be made of strontium titanate or barium titanate.

In the embodiment of the present application, the dielectric layer may also comprise two or more amorphous layers.

When there are at least two amorphous layers, a perovskite layer is provided between every two adjacent amorphous layers. The thickness of the perovskite layer located between the two amorphous layers may be less than or equal to 5 nm. The perovskite layer between the two amorphous layers may be an undoped perovskite layer. This design can increase the dielectric constant of the capacitor structure. Of course, the embodiment of the present application is not limited herein. The perovskite layer between the two amorphous layers may also be a doped perovskite layer. Alternatively, among the perovskite layers between the amorphous layers, some of the perovskite layers are undoped perovskite layers, and some of the perovskite layers are doped perovskite layers.

Figure 6:
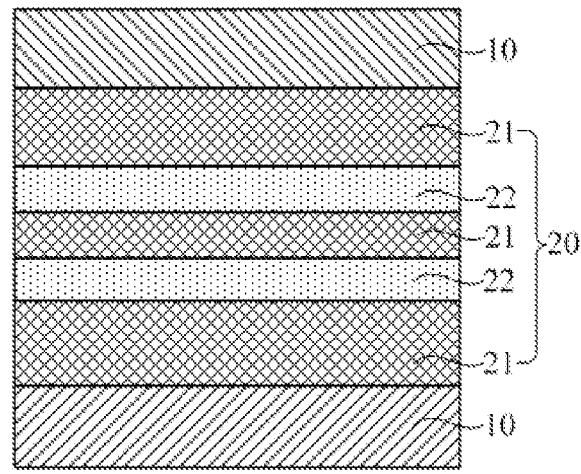
FIG. 6 is a second schematic diagram of the capacitor structure according to an embodiment of the present application.

Referring to FIG. 6, the dielectric layer 20 comprises a perovskite layer 21, an amorphous layer 22, a perovskite layer 21, an amorphous layer 22 and a perovskite layer 21 stacked in sequence from bottom to top. That is, the dielectric layer 20 comprises three perovskite layers 21 and two amorphous layers 22 located between the three perovskite layers 21. As shown in FIG. 6, the two outermost perovskite layers 21 among the three perovskite layers 21 are in one-to-one correspondence and contact with the two electrodes 10.

Figure 7:
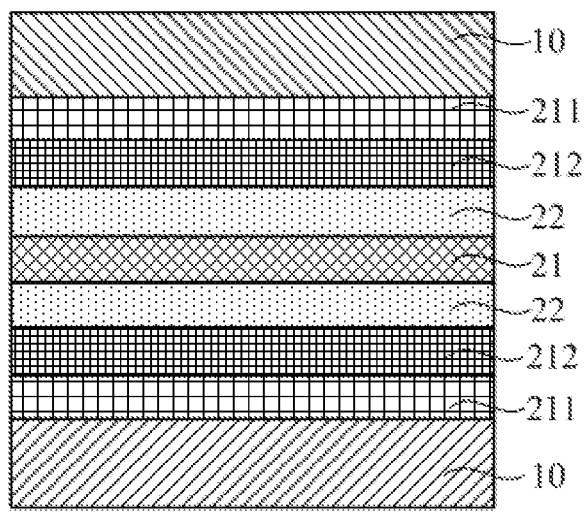
FIG. 7 is a third schematic diagram of the capacitor structure according to an embodiment of the present application.

In some possible examples, referring to FIG. 7, the two outermost perovskite layers 21 may comprise two sub-layers. As shown in FIG. 7, one of the two sub-layers is a doped perovskite layer 211 in contact with the electrode 10, and the other of the two sub-layers is an undoped perovskite layer 212. In this way, there is a high shift in the conduction band between the doped perovskite layer 211 and the electrode 10, which can suppress the generation of the leakage current, thereby further reducing the leakage current of the capacitor structure.

As shown in FIG. 7, the capacitor structure comprises an electrode 10, a doped perovskite layer 211, an undoped perovskite layer 212, an amorphous layer 22, a perovskite layer 21, an amorphous layer 22, an undoped perovskite layer 212, a doped perovskite layer 211 and an electrode 10 in sequence from bottom to top.

In the embodiment of the present application, the capacitor structure comprises two electrodes 10 and a dielectric layer 20. The two electrodes 10 are arranged oppositely and the dielectric layer 20 is provided between the two electrodes 10. The dielectric layer 20 comprises two or more perovskite layers 21 stacked. Two outermost perovskite layers 21 are in one-to-one correspondence and contact with the two electrodes 10. An amorphous layer 22 is provided between every two adjacent perovskite layers 21. The amorphous layer 22 is made of an amorphous structure material, which can suppress the output of electrons and reduce the leakage current of the capacitor structure, thereby improving the performance of the capacitor structure.

Embodiment 2

The embodiment of the present application further provides a memory. The memory comprises a transistor and a capacitor structure. The capacitor structure is used to store data information, and the transistor is used to control the reading and writing of data information in the capacitor structure. Referring to FIGS. 1 to 7, the capacitor structure comprises two electrodes 10 arranged oppositely and a dielectric layer 20 located between the two electrodes 10. That is, the capacitor structure is composed of the two electrodes 10 and the dielectric layer 20.

The two electrodes 10 may be arranged in parallel, and the electrodes 10 may be metal electrodes 10. The dielectric layer 20 may comprise at least two perovskite layers 21, and the at least two perovskite layers 21 are stacked. Two outermost perovskite layers 21 are in contact with the two electrodes 10, respectively. That is, the two outermost perovskite layers 21 are in one-to-one correspondence and contact with the two electrodes 10.

The perovskite layer 21 has a high dielectric constant (high k). Exemplarily, the dielectric constant of the perovskite layer 21 may be 40-300. An amorphous layer 22 may be provided between every two adjacent perovskite layers 21. The amorphous layer 22 may be formed by using a PVD process, a CVD process or an ALD process.

The amorphous layer 22 may be made of an amorphous structure material (amorphous material), comprising, for example, aluminum oxide ($Al_2O_3$) or silicon oxide ($SiO_2$). The atoms or molecules are arranged in a disorderly state in the amorphous structure material, so electrons are not easy to migrate in the amorphous structure material. Therefore, the amorphous layer 22 can suppress the output of electrons and reduce the leakage current of the capacitor structure, thereby improving the performance of the capacitor structure. The thickness of the amorphous layer 22 may be less than or equal to 5 nm.

It should be noted that the dielectric layer 20 may comprise one amorphous layer 22, that is, the dielectric layer 20 may be composed of a perovskite layer 21, an amorphous layer 22 and a perovskite layer 21, as shown in FIG. 1. The dielectric layer 20 may also comprise two amorphous layers 22, that is, the dielectric layer 20 may be composed of a perovskite layer 21, an amorphous layer 22, a perovskite layer 21, an amorphous layer 22 and a perovskite layer 21, as shown in FIG. 6. The dielectric layer 20 may also comprise more than two amorphous layers 22, and the dielectric layer 20 may be defined with reference to the structure comprising two amorphous layers 22.

In the embodiment of the present application, the capacitor structure comprises a transistor and a capacitor structure. The dielectric layer 20 of the conductor structure comprises two or more perovskite layers 21 stacked. Two outermost perovskite layers 21 are in one-to-one correspondence and contact with the two electrodes 10. An amorphous layer 22 is provided between every two adjacent perovskite layers 21. The amorphous layer 22 is made of an amorphous structure material, which can suppress the output of electrons and reduce the leakage current of the capacitor structure, thereby achieving a low leakage current and improving the performance of the memory.

Embodiment 3

Figure 8:
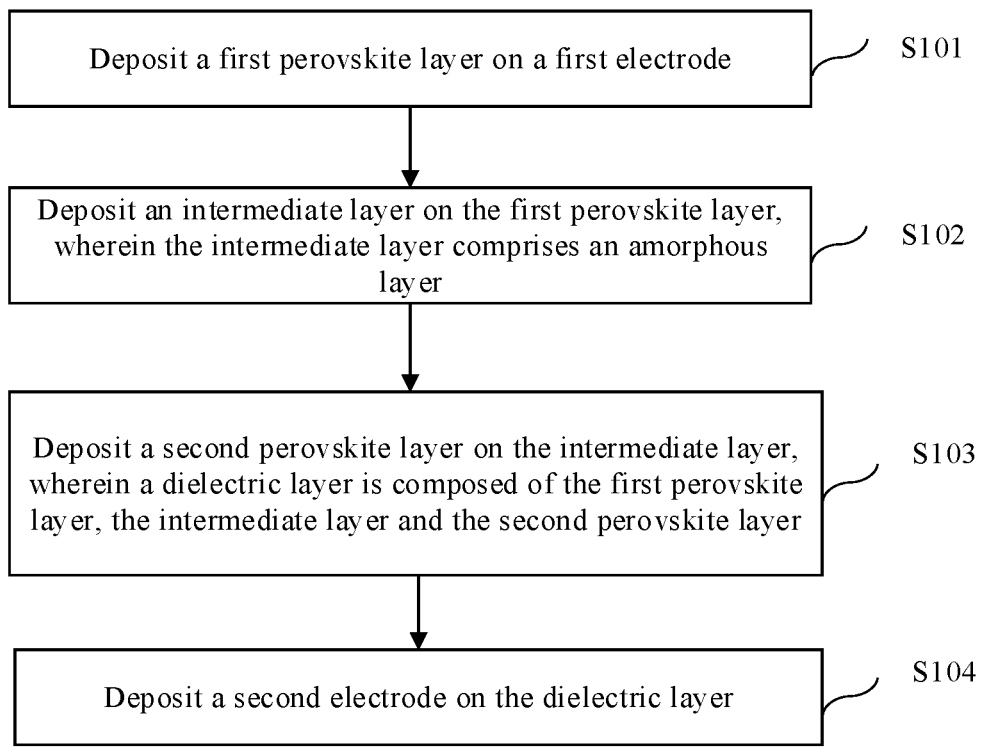
FIG. 8 is a flowchart of a manufacturing method for capacitor structure according to an embodiment of the present application.

Referring to FIG. 8, the embodiment of the present application further provides a manufacturing method for capacitor structure, in order to manufacture a capacitor structure with a small leakage current. The manufacturing method comprises the following steps:

S101: Deposit a first perovskite layer on a first electrode.

Figure 9:
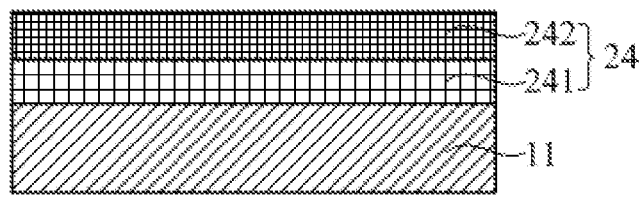
FIG. 9 is a schematic diagram of a structure after forming a first perovskite layer according to an embodiment of the present application.

A first perovskite layer 24 is deposited on a first electrode 11. In some possible examples, referring to FIG. 9, the depositing the first perovskite layer 24 on the first electrode 11 comprises:

First, a first sub-layer 241 is deposited on the first electrode 11, and the first sub-layer 241 is a doped perovskite layer.

Exemplarily, the first sub-layer 241 may be formed on the first electrode 11 by using a CVD process, a PVD process or an ALD process, and the thickness of the first sub-layer 241 may be less than or equal to 5 nm. The first sub-layer 241 may be a doped perovskite layer. For example, the doped perovskite layer may be made of strontium titanate doped with aluminum or barium titanate doped with silicon. In this way, there is a high shift in the conduction band between the doped perovskite layer and the first electrode 11, which can suppress the generation of the leakage current, reducing the leakage current of the capacitor structure.

Then, a second sub-layer 242 is deposited on the first sub-layer 241. The second sub-layer 242 is an undoped perovskite layer. The first perovskite layer 24 is composed of the first sub-layer 241 and the second sub-layer 242.

Exemplarily, the second sub-layer 242 is deposited on the first sub-layer 241, and the thickness of the second sub-layer 242 may be less than or equal to 5 nm. The second sub-layer 242 may be an undoped perovskite layer. For example, the undoped perovskite layer may be made of strontium titanate or barium titanate. The undoped perovskite layer typically has a high dielectric constant, which achieves a high dielectric constant of the capacitor structure.

S102: Deposit an intermediate layer on the first perovskite layer, wherein the intermediate layer comprises an amorphous layer.

The intermediate layer 23 may comprise one or more than one amorphous layer 22. The thickness of each amorphous layer 22 may be less than or equal to 5 nm. The amorphous layer 22 is made of an amorphous structure material (amorphous material). The atoms or molecules are arranged in a disorderly state in the amorphous structure material, so electrons are not easy to migrate in the amorphous structure material. Therefore, the amorphous layer 22 can suppress the output of electrons and reduce the leakage current of the capacitor structure, thereby improving the performance of the capacitor structure.

When the intermediate layer 23 comprises two or more amorphous layers 22, an intermediate perovskite layer 25 may be provided between every two adjacent amorphous layers 22, and the intermediate perovskite layer 25 may be an undoped perovskite layer to increase the dielectric constant of the capacitor structure. Of course, the embodiment of the present application is not limited herein, and the intermediate perovskite layer 25 may also be a doped perovskite layer.

It is understandable that when the intermediate layer 23 comprises two or more amorphous layers 22, these layers of the intermediate layer 23 are sequentially deposited on the first perovskite layer 24.

Figure 10:
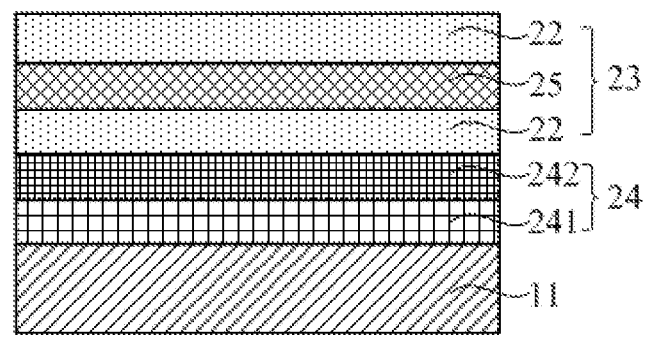
FIG. 10 is a schematic diagram of a structure after forming an intermediate layer according to an embodiment of the present application.

Exemplarily, the intermediate layer 23 comprises two amorphous layers 22, and an intermediate perovskite layer 25 is provided between the two amorphous layers 22. The amorphous layer 22, the intermediate perovskite layer 25 and the amorphous layer 22 are sequentially deposited on the first perovskite layer 24, and the intermediate layer 23 is composed of the amorphous layer 22, the intermediate perovskite layer 25 and the amorphous layer 22 shown in FIG. 10.

S103: Deposit a second perovskite layer on the intermediate layer, wherein a dielectric layer is composed of the first perovskite layer, the intermediate layer and the second perovskite layer.

The second perovskite layer 26 is deposited on the intermediate layer 23. In some possible examples, the depositing the second perovskite layer 26 on the intermediate layer 23 comprises:

First, a third sub-layer 261 is deposited on the intermediate layer 23, and the third sub-layer 261 is an undoped perovskite layer. Exemplarily, the thickness of the third sub-layer 261 may be less than or equal to 5 nm. The third sub-layer 261 is an undoped perovskite layer, which further increases the dielectric constant of the capacitor structure.

Then, a fourth sub-layer 262 is deposited on the third sub-layer 261, wherein the fourth sub-layer 262 is a doped perovskite layer, and the second perovskite layer 26 is composed of the third sub-layer 261 and the fourth sub-layer 262. Exemplarily, the thickness of the fourth sub-layer 262 may be less than or equal to 5 nm. The fourth sub-layer 262 may be a doped perovskite layer, which further reduces the leakage current of the capacitor structure.

Figure 11:
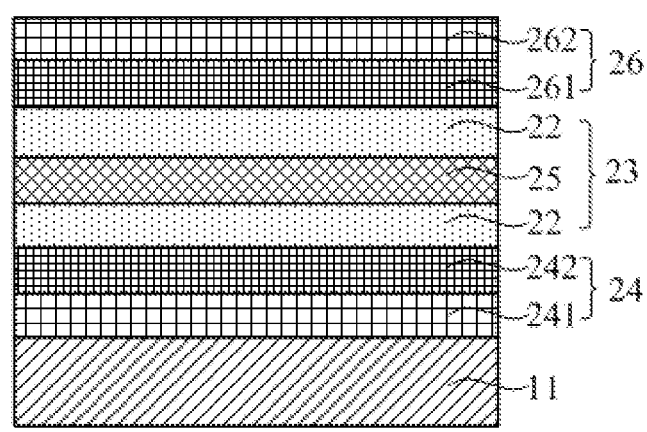
FIG. 11 is a schematic diagram of a structure after forming a second perovskite layer according to an embodiment of the present application.

A dielectric layer 20 is composed of the first perovskite layer 24, the intermediate layer 23 and the second perovskite layer 26. It should be noted that when the intermediate layer 23 comprises one amorphous layer 22, the dielectric layer 20 comprises a first perovskite layer 24, an amorphous layer 22 and a second perovskite layer 26 stacked in sequence. When the intermediate layer 23 comprises two amorphous layers 22, as shown in FIG. 11, the dielectric layer 20 comprises a first perovskite layer 24, an amorphous layer 22, an intermediate perovskite layer 25, an amorphous layer 22 and a second perovskite layer 26 stacked in sequence. When the intermediate layer 23 comprises three amorphous layers 22, the dielectric layer 20 comprises a first perovskite layer 24, an amorphous layer 22, an intermediate perovskite layer 25, an amorphous layer 22, an intermediate perovskite layer 25, an amorphous layer 22 and a second perovskite layer 26 stacked in sequence. When the intermediate layer 23 comprises more than three amorphous layers 22, the dielectric layer 20 may be defined with reference to the structure described above.

S104: Deposit a second electrode on the dielectric layer.

Figure 12:
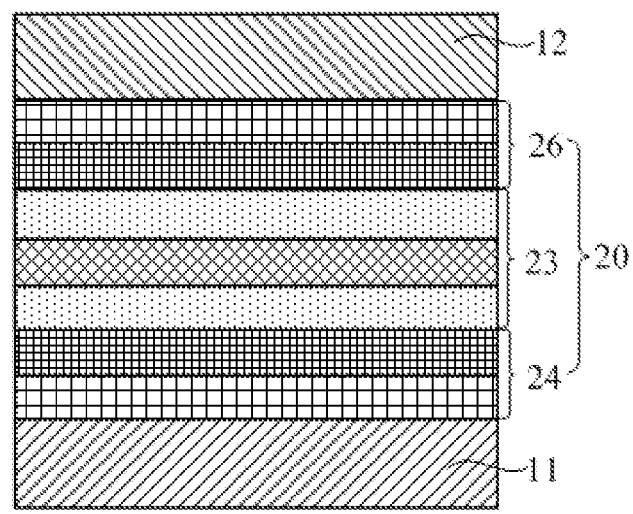
FIG. 12 is a schematic diagram of a structure after forming a second electrode according to an embodiment of the present application.

As shown in FIG. 12, the second electrode 12 is deposited on the dielectric layer 20. The second electrode 12 is in contact with the second perovskite layer 26 in the dielectric layer 20. A capacitor structure is composed of the first electrode 11, the dielectric layer 20 and the second electrode 12.

In the manufacturing method for capacitor structure provided by the embodiment of the present application, first, a first perovskite layer 24 is deposited on a first electrode 11. Second, an intermediate layer 23 is deposited on the first perovskite layer 24. The intermediate layer 23 comprises an amorphous layer 22, and the amorphous layer 22 can suppress the output of electrons, thereby reducing the leakage current of the capacitor structure. Third, a second perovskite layer 26 is deposited on the intermediate layer 23. A dielectric layer 20 is composed of the first perovskite layer 24, the intermediate layer 23 and the second perovskite layer 26. Finally, a second electrode 12 is deposited on the dielectric layer 20. A capacitor structure is composed of the first electrode 11, the dielectric layer 20 and the second electrode 12, which has a low leakage current and desirable performance.

Each embodiment in the specification of the present application is described in a progressive manner. Each embodiment focuses on the difference from other embodiments, and the same and similar parts between the embodiments may refer to each other.

It is understandable for those skilled in the art that in the disclosure of the present application, terms such as "longitudinal", "transverse" "upper", "lower", "front", "rear", "left", "right" "vertical", "horizontal", "top", "bottom", "inside" and "outside" indicate the orientation or position relationships based on the drawings. They are merely intended to facilitate and simplify the description of the present application, rather than to indicate or imply that the mentioned system or components must have a specific orientation or must be constructed and operated in a specific orientation. Therefore, these terms should not be construed as a limitation to the present application.

In the descriptions of this specification, the description with reference to the term "one implementation", "some implementations", "an exemplary implementation", "an example", "a specific example" or "some examples" means that a specific feature, structure, material or characteristic described in combination with the implementation(s) or example(s) is included in at least one implementation or example of the present application. In this specification, the schematic expression of the above terms does not necessarily refer to the same implementation or example. Moreover, the described specific feature, structure, material or characteristic may be combined in an appropriate manner in any one or more implementations or examples.

Finally, it should be noted that the above embodiments are merely used to explain the technical solutions of the present application, but are not intended to limit the present application. Although the present application is described in detail with reference to the foregoing embodiments, those of ordinary skill in the art should understand that they can still modify the technical solutions described in the foregoing embodiments, or make equivalent substitutions on some or all technical features therein. These modifications or substitutions do not make the essence of the corresponding technical solutions deviate from the spirit and scope of the technical solutions of the embodiments of the present application.

What is claimed is:

1. A capacitor structure, comprising
two electrodes arranged oppositely and a dielectric layer located between the two electrodes, wherein
the dielectric layer comprises at least two perovskite layers stacked;
an amorphous layer is provided between every two adjacent perovskite layers;
two outermost perovskite layers of the at least two perovskite layers are in contact with the two electrodes, respectively;
at least one of the two outermost perovskite layers comprises two sub-layers; and
one of the two sub-layers is a doped perovskite layer in contact with the electrode, and the other of the two sub-layers is an undoped perovskite layer.

2. The capacitor structure according to claim 1, wherein the doped perovskite layer is made of strontium titanate doped with aluminum or barium titanate doped with silicon.

3. The capacitor structure according to claim 1, wherein the undoped perovskite layer is made of strontium titanate or barium titanate.

4. The capacitor structure according to claim 1, wherein the thickness of each of the two sub-layers is less than or equal to 5 nm.

5. The capacitor structure according to claim 1, wherein the amorphous layer is made of a material comprising aluminum oxide or silicon oxide.

6. The capacitor structure according to claim 5, wherein the thickness of the amorphous layer is less than or equal to 5 nm.

7. The capacitor structure according to claim 1, wherein the amorphous layer and the perovskite layer are formed by using a physical vapor deposition process, a chemical vapor deposition process or an atomic layer deposition process.

8. The capacitor structure according to claim 1, wherein the dielectric layer comprises two or more amorphous layers; the perovskite layer located between two amorphous layers is an undoped perovskite layer.

9. The capacitor structure according to claim 8, wherein the thickness of the perovskite layer located between two amorphous layers is less than or equal to 5 nm.

10. A memory, comprising
a transistor and the capacitor structure according to claim 1.

11. A manufacturing method for capacitor structure, comprising:
depositing a first sub-layer on the first electrode, the first sub-layer being a doped perovskite layer; and
depositing a second sub-layer on the first sub-layer, the second sub-layer being an undoped perovskite layer; and the first perovskite layer being composed of the first sub-layer and the second sub-layer
depositing an intermediate layer on the first perovskite layer, the intermediate layer comprising an amorphous layer;
depositing a second perovskite layer on the intermediate layer, and a dielectric layer being composed of the first perovskite layer, the intermediate layer and the second perovskite layer; and
depositing a second electrode on the dielectric layer.

12. The manufacturing method for capacitor structure according to claim 11, wherein
the intermediate layer comprises two or more amorphous layers, and an intermediate perovskite layer is provided between every two adjacent amorphous layers.

13. The manufacturing method for capacitor structure according to claim 12, wherein
the intermediate perovskite layer is an undoped perovskite layer.

14. A manufacturing method for capacitor structure, comprising:
depositing a first perovskite layer on a first electrode;
depositing an intermediate layer on the first perovskite layer, the intermediate layer comprising an amorphous layer;
depositing a second perovskite layer on the intermediate layer, and a dielectric layer being composed of the first perovskite layer, the intermediate layer and the second perovskite layer; and
depositing a second electrode on the dielectric layer; wherein
the depositing a second perovskite layer on the intermediate layer comprises:
depositing a third sub-layer on the intermediate layer, the third sub-layer being an undoped perovskite layer; and
depositing a fourth sub-layer on the third sub-layer, the fourth sub-layer being a doped perovskite layer; and the second perovskite layer being composed of the third sub-layer and the fourth sub-layer.

* * * * *